(12) United States Patent
Hawkes et al.

(10) Patent No.: US 7,200,014 B1
(45) Date of Patent: Apr. 3, 2007

(54) SYSTEM AND METHOD FOR TRANSFERRING DUTY CYCLE INFORMATION IN AN ISOLATED DC/DC CONVERTER OR OTHER CIRCUIT

(75) Inventors: Charles E. Hawkes, Cary, NC (US); Arthur W. Kelley, Raleigh, NC (US)

(73) Assignee: Linear Technology Corporation, Milpitas, CA (US)

( * ) Notice: Subject to any disclaimer, the term of this patent is extended or adjusted under 35 U.S.C. 154(b) by 303 days.

(21) Appl. No.: 10/992,945

(22) Filed: Nov. 22, 2004

(51) Int. Cl.
*H02M 3/335* (2006.01)
*H03K 5/22* (2006.01)

(52) U.S. Cl. .................................................. 363/21.1
(58) Field of Classification Search ................... 363/16, 363/20, 21.01, 21.04, 21.1, 21.18, 123, 131, 363/159, 163–165; 323/268–273, 275–279
See application file for complete search history.

(56) References Cited

U.S. PATENT DOCUMENTS

| | | | | |
|---|---|---|---|---|
| 5,821,740 | A * | 10/1998 | Hodgins et al. | 323/277 |
| 6,121,760 | A * | 9/2000 | Marshall et al. | 323/282 |
| 6,548,977 | B2 * | 4/2003 | Vu et al. | 318/442 |
| 6,586,898 | B2 * | 7/2003 | King et al. | 318/254 |
| RE38,940 | E * | 1/2006 | Isham et al. | 323/224 |

* cited by examiner

*Primary Examiner*—Matthew V. Nguyen
(74) *Attorney, Agent, or Firm*—McDermott Will & Emery LLP

(57) ABSTRACT

A signal processing methodology and circuit for supplying bias power and duty cycle information across an isolation barrier, wherein, at an input side of the isolation barrier at least one input signal carrying input duty cycle information, together with DC bias power, is received and encoded on a constant repetition rate, constant duty cycle carrier waveform. Encoding is carried out by an encoder implemented to encode the carrier waveform with a marker, such as a waveform discontinuity, at a timing corresponding to the input duty cycle information, and wherein the presence of the marker leaves the average value of the carrier waveform unaffected. At the output side of the isolation barrier, the duty cycle information may be received by a decoder, the input duty cycle information detected to reconstruct the at least one input signal, and optionally DC bias power extracted from the carrier waveform. An exemplary embodiment is based on PWM encoding and decoding of a bipolar square wave carrier waveform of constant repetition rate and duty cycle. Duty cycle information in the form of short pulse discontinuities may be superimposed on successive half cycles of the carrier waveform, to enable two independent PWM signals to be processed per cycle.

39 Claims, 10 Drawing Sheets

Encoder with DA at Nominal Duty Cycle & DB > DMAX

Encoder with DA at Zero Duty Cycle and DB < DMIN

Decoder with DA at Nominal Duty Cycle & DB > DMAX

Decoder with DA at Zero Duty Cycle and DB < DMIN

SYSTEM AND METHOD FOR TRANSFERRING DUTY CYCLE INFORMATION IN AN ISOLATED DC/DC CONVERTER OR OTHER CIRCUIT

TECHNICAL FIELD

The subject matter of this disclosure relates generally to DC/DC conversion, and more particularly, to system and methodology for sending PWM duty cycle information through a transformer isolated DC/DC converter or other circuit. A particular embodiment includes transmission of PWM duty cycle information together with bias power across an isolation barrier.

BACKGROUND INFORMATION

It occasionally is necessary to transmit both bias power and Pulse Width Modulation (PWM) duty cycle information across the isolation barrier, usually a transformer, of a circuit such as an isolated DC/DC converter, which receives an input DC voltage of particular magnitude and produces an output DC voltage of different magnitude. The output DC voltage may be of magnitude greater than, less than or equal to the magnitude of the input DC voltage, depending upon converter type. For example, in one type of isolated DC/DC converter implementing transformer isolation and pulse width modulation, termed a PWM DC—DC converter, information on one or more sequences of PWM duty cycle pulses corresponding to the desired output DC voltage magnitude, together with DC bias power, must be transferred from one side of the isolation barrier to the other side. This ordinarily is accomplished using a separate pulse transformer for coupling each PWM duty cycle sequence across the isolation barrier, and implementing sources of DC power on each side. It would be desirable to effect a means for combining transmission of bias power and PWM duty cycle information across the isolation barrier, in an efficient manner, so as to reduce component count and circuit complexity.

One known method for combining DC power and PWM duty cycle information is shown in FIG. 1, depicting a circuit 100 in which an isolation barrier between input and output is produced by a pulse transformer 102. At the primary side of the transformer 102 is a first DC blocking capacitor 104, and at the secondary side is a DC restorer circuit comprising a second capacitor 106 and diode 108, and a half-wave rectifier consisting of diode 110 and second DC filter capacitor 114. DC bias magnitude is limited by zener diode 112.

Although structurally simple, this circuit has several shortcomings. The value of voltage across the two DC blocking capacitors is determined by the PWM duty cycle information being transmitted across the isolation barrier. Duty cycle information can be lost completely for a period of time upon sudden and substantial change in the value of the duty cycle of the input waveform because the value of voltage across the two DC blocking capacitors cannot respond quickly enough. Another disadvantage of this type of circuit is that at low input PWM duty cycle, production of DC bias power is inadequate because the energy content of a low duty cycle waveform is small. And furthermore, a duty cycle of zero cannot be maintained for any substantial period without losing bias power transfer altogether. As another disadvantage of this type of circuit, there is no possibility of transferring more than one PWM duty cycle waveform simultaneously, as would be required in multiphase converter systems.

FIG. 2 depicts another type of circuit 200 commonly implemented to send PWM duty cycle information through a pulse transformer 202. In this Figure, the primary circuit of pulse transformer 202 comprises primary winding 202*a* in series with an RC circuit consisting of capacitor 204 and resistor 206, and the secondary circuit consists simply of a load resistor 208 connected in shunt with the secondary winding 202*b* of the transformer.

This circuit is at a disadvantage at least within the context of a PWM DC—DC converter in that it does not provide any means for transferring DC bias power across the transformer 202. In addition, if a turn-off pulse is missed, the effective PWM duty cycle transmitted across the transformer 28 can go to 100%, resulting in potential damage to the converter. Finally, because only a single PWM duty cycle waveform can be transmitted, multiphase operation is not possible.

The subject matter described hereinafter addresses and corrects the shortcomings of conventional technology, by providing circuitry and methodology for carrying out transfer of PWM duty cycle information and bias power across the isolation transformer of an isolated circuit, such as a PWM DC—DC converter, embedded in a constant repetition rate and PWM duty cycle carrier signal so as to avoid transformer saturation and optimize power transfer. The inventive circuitry and methodology described herein furthermore establish a prescribed maximum PWM duty cycle limit, such as 50% even if pulses are missed, allowing for transmission of two or more independent PWM duty cycle waveforms.

SUMMARY OF THE DISCLOSURE

In accord with an aspect of the disclosure, a method of supplying variable PWM duty cycle information across an isolation barrier is carried out by, at an input side of the isolation barrier, receiving at least one input signal containing PWM duty cycle information and producing a carrier signal having a waveform of generally constant repetition rate and duty cycle, in which at least a portion of the carrier signal is encoded to have a marker, such as a waveform discontinuity, at a timing corresponding to input PWM duty cycle information, wherein presence of the marker leaves the average value of the carrier waveform substantially unaffected. At an output side of the isolation barrier, the method may include detecting the PWM duty cycle information in the carrier signal, and using the detected PWM duty cycle information, reconstructing the input variable PWM duty cycle signal. In accord with another aspect, DC bias power may be extracted from the carrier signal for use elsewhere.

In a preferred embodiment, encoding of the PWM input signal is performed by superimposing a brief pulse on a bipolar carrier waveform. Alternate carrier waveform halves may be encoded with mutually independent sequences of PWM duty cycle information, so that each carrier cycle may carry two independent PWM signals. The carrier waveform may be of 50% duty cycle for this purpose. Alternatively, the carrier waveform may be of greater than 50% duty cycle especially if only one sequence of PWM duty cycle information is to be carried by the carrier.

The method may include establishing zero PWM duty cycle information within the waveform. A preferred embodiment provides generating a pulse of prescribed fixed duration in response to a transition at the end of each half cycle of the bipolar carrier waveform to initiate a reference interval, and detecting an absence of a transition at the beginning of the other half cycle of the carrier waveform occurring within the reference interval for determining a zero PWM duty cycle information in that half cycle of the waveform.

A signal processing circuit for implementing the methodology may comprise an encoder circuit such as a PWM encoder, at the input side of the isolation barrier, configured for receiving at least one input signal containing input PWM duty cycle information, and producing a carrier signal having a waveform of generally constant repetition rate and duty cycle encoded with a marker, such as a waveform discontinuity, at a timing corresponding to the input PWM duty cycle information, in which the marker leaves the average value of the carrier waveform substantially unaffected. On the other side of the isolation barrier in accord with a further aspect of the disclosure may be provided a decoder circuit, such as a PWM decoder, configured to receive the carrier signal and decode the PWM duty cycle information contained therein and reconstruct the input signal. A DC power extraction circuit also may be included, configured for extracting DC bias power from the carrier signal.

The DC restorer circuit may comprise a bridge rectifier circuit coupled to a capacitor on which DC bias is developed, in which the bridge rectifier circuit preferably comprises a full wave bridge circuit.

In accord with another aspect, the circuit may include a zero PWM duty cycle detection circuit configured to establish a zero duty cycle information modulated waveform. The decoder may include a one-shot timer circuit triggered in response to a transition at the end of each half cycle of the carrier waveform to establish a reference interval, and a circuit for detecting the absence of an edge at the beginning of the next half cycle of the waveform occurring within the reference interval, for determining a zero duty cycle information in that half cycle of the waveform.

The signal processing methodology and circuit may be implemented within a polyphase synchronous forward converter.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

DETAILED DESCRIPTION OF PREFERRED EMBODIMENTS

Overview

Figure 1:
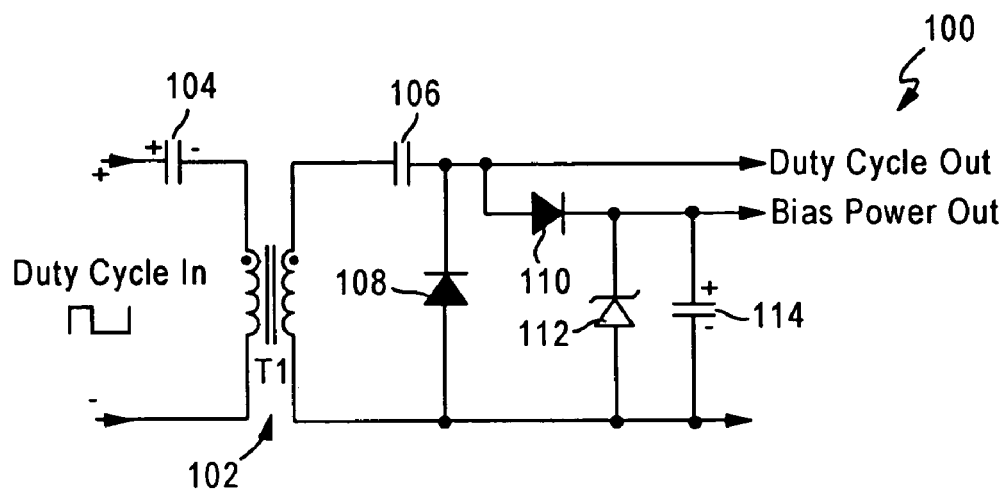
FIG. 1 is a circuit diagram showing a conventional circuit for sending power and PWM duty cycle information, across a pulse transformer.
Figure 2:
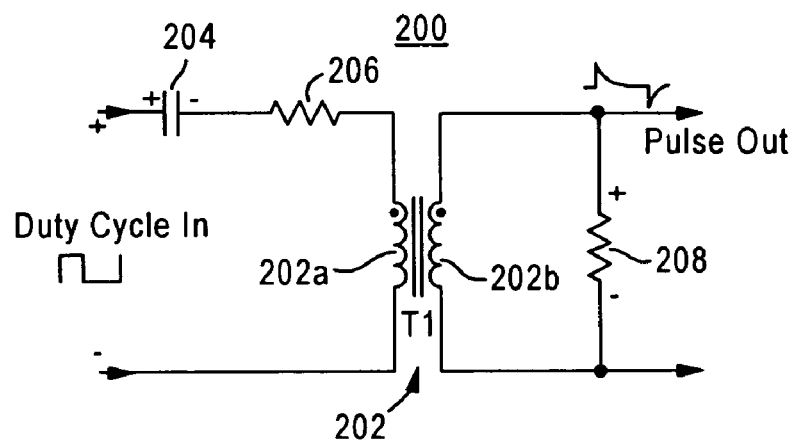
FIG. 2 is a diagram of a conventional circuit for sending PWM duty cycle information across a pulse transformer.
Figure 3:
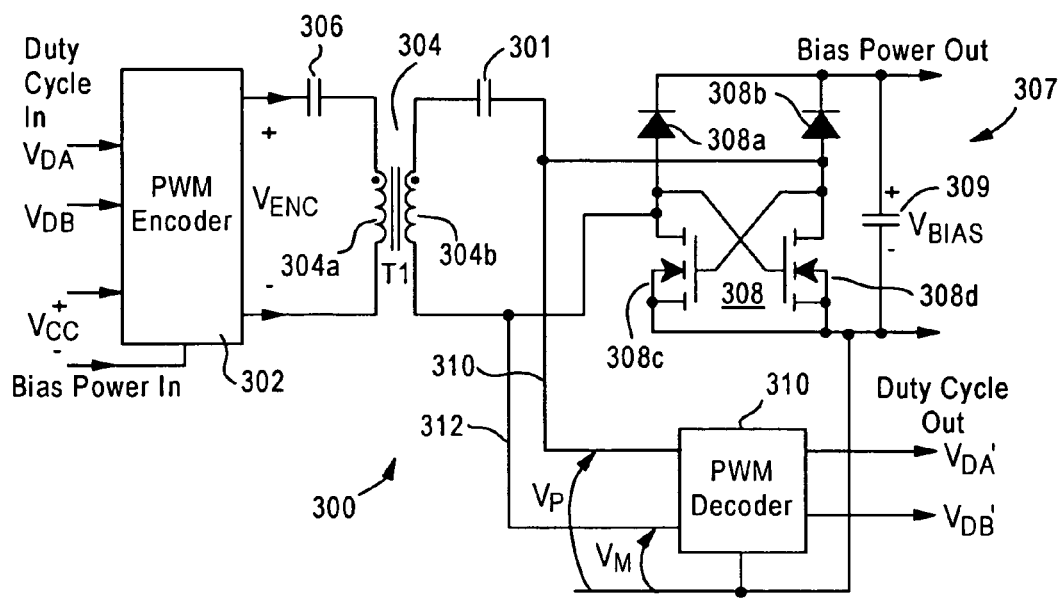
FIG. 3 is a simplified diagram showing an exemplary implementation per the invention of a circuit for receiving two independent PWM duty cycle inputs, together with bias power, and transferring the same across a pulse transformer at which the PWM duty cycle signals are restored and bias power extracted.

FIG. 3 depicts an implementation of the teachings herein, in which two input PWM duty cycle signals $V_{DA}$, $V_{DB}$, together with a source of DC bias power $V_{CC}$, are applied to a signal processing circuit 300 which couples the input signals and bias power across an isolation transformer on an encoded carrier $V_{ENC}$. In overview, circuit 300, powered by voltage source $V_{CC}$, is configured to encode the first and second input signals $V_{DA}$ and $V_{DB}$ into the form of a carrier waveform $V_{ENC}$ encoded with information describing the duty cycles of the PWM input signals, and transmit the encoded carrier across an isolation transformer 304. At the secondary side of the transformer, the circuit 300 decodes the carrier $V_{ENC}$ to reconstruct the input signals $V_{DA}$ and $V_{DB}$, as output signals $V_{DA'}$ and $V_{DB'}$ while optionally but advantageously extracting DC bias power therefrom to be used for any purpose. The carrier waveform preferably is a bipolar waveform, of generally constant repetition rate, and of a duty cycle that is fixed and substantial, such as 50%, so as to transfer substantial and continuous power across the transformer for extraction. Successive half cycles of the carrier are encoded with PWM duty cycle information corresponding to the first and second PWM input signals $V_{DA}$ and $V_{DB}$, respectively. Although a specific circuit is described herein by way of an example of how the principles of what is taught herein may be implemented, it is to be understood that other circuit configurations and methodologies are possible.

In the described embodiment, signal processing circuit 300 implements a PWM encoder 302, details of which are given later, that produces the bipolar encoded carrier $V_{ENC}$, which is applied to the primary winding 304a of the pulse transformer 304 through a DC blocking capacitor 306. The capacitor 306 removes the DC bias component $V_{CC}$ so as to avoid saturation of the isolation transformer 304, preferably a pulse transformer, while passing bias power in the form of an AC component in the carrier waveform. On the secondary side of transformer 304 is secondary winding 304b, preferably but not necessarily wound in the same sense as that of primary winding 304a, and coupled through a DC restoring capacitor 301 to a bias power extraction circuit 307 and a PWM decoder 310 that may be connected in parallel with each other as illustrated.

Bias power extraction circuit 307 comprises a bridge rectifier 308 together with filter capacitor 309 for storing power extracted from the carrier $V_{ENC}$ in the form of a DC voltage ($V_{BIAS}$), to be supplied for utilization elsewhere. Bridge rectifier 308, shown in FIG. 3 in the exemplary form of a full wave bridge rectifier, is applied to rectify the bipolar carrier $V_{ENC}$ produced by encoder 302 and coupled across transformer 304, and efficiently extract DC bias power from the carrier waveform. The input nodes of bridge rectifier 308, connected via capacitor 301 to the transformer secondary winding 304b, receive $V_{ENC}$, that, following rectification via bridge rectifier 308, charges capacitor 309 to provide full wave rectified output signals $V_P$ and $V_M$ and bias power ($V_{BIAS}$) as indicated. In the embodiment shown, the bridge rectifier 308 comprises diodes 308a, 308b on upper legs of the bridge, and on the lower legs are active devices 308c, 308d, preferably in the form of field effect transistors. The terms "upper" and "lower" have no significance other than for illustration. The two field effect transistors 308c, 308d are cross-coupled, so as to be naturally commutated, hence improving efficiency of power transfer while allowing only one of the secondary winding outputs $V_P$, $V_M$ to be high at any given time. Alternatively, a complimentary drive arrangement may be implemented for forced commutation. The full bridge as presented in the illustrated embodiment is advantageous in that maximum utilization is made of the pulse transformer 304 for transferring power.

PWM decoder 310 is connected to receive secondary winding outputs $V_P$, $V_M$, which are of equal duration and in the form approximately of repetitive square waves, but of particular shape governed by the rectifier circuit 308. The decoder 310 serves to extract the PWM duty cycle information individually from the input signals $V_{DA}$, and $V_{DB}$, to reconstruct the original input signals as output signals $V_{DA'}$, and $V_{DB'}$, shown in FIG. 3.

Methodology

Information describing the duty cycle of PWM input signals $D_A$ and $D_B$ is encoded into the carrier $V_{ENC}$, in accord with an aspect of the teachings herein, by providing a marker in the carrier that may be detected at the secondary side of transformer 304 and used to reconstruct the input signals, to produce output signals shown as $V_{DA'}$ and $V_{DB'}$ in FIG. 3. In the embodiment described, the detectable marker is implemented as a brief pulse superimposed on the carrier waveform at a timing in each half cycle of the waveform that corresponds to the duty cycle of the respective PWM input signal.

Figure 4:
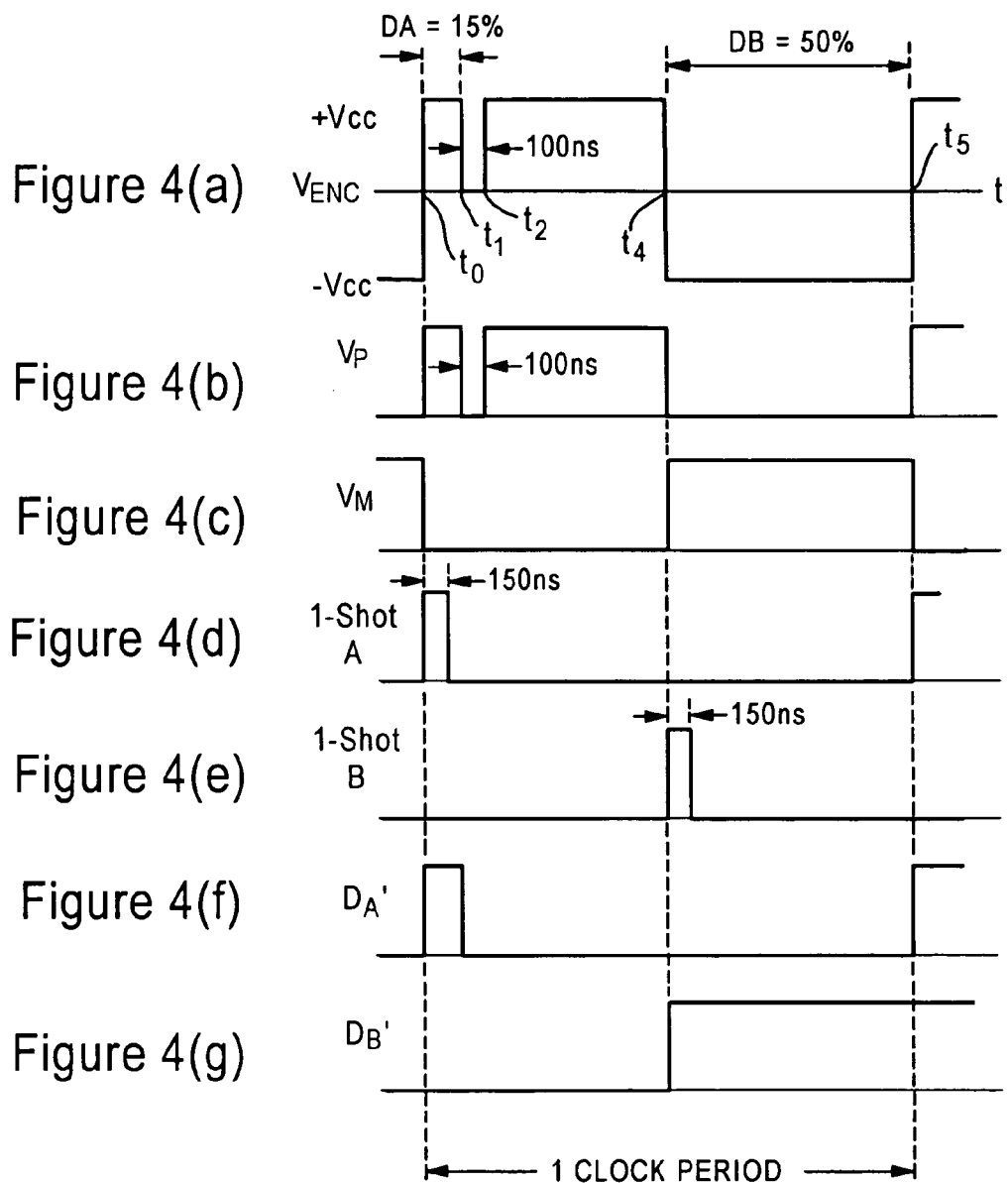
FIGS. 4(a)–4(g) are waveforms explaining the general operation of the PWM encoder shown in FIG. 3, for an exemplary encoding of two input signals of duty cycles $D_A=15\%$ and $D_B=50\%$.
Figure 5:
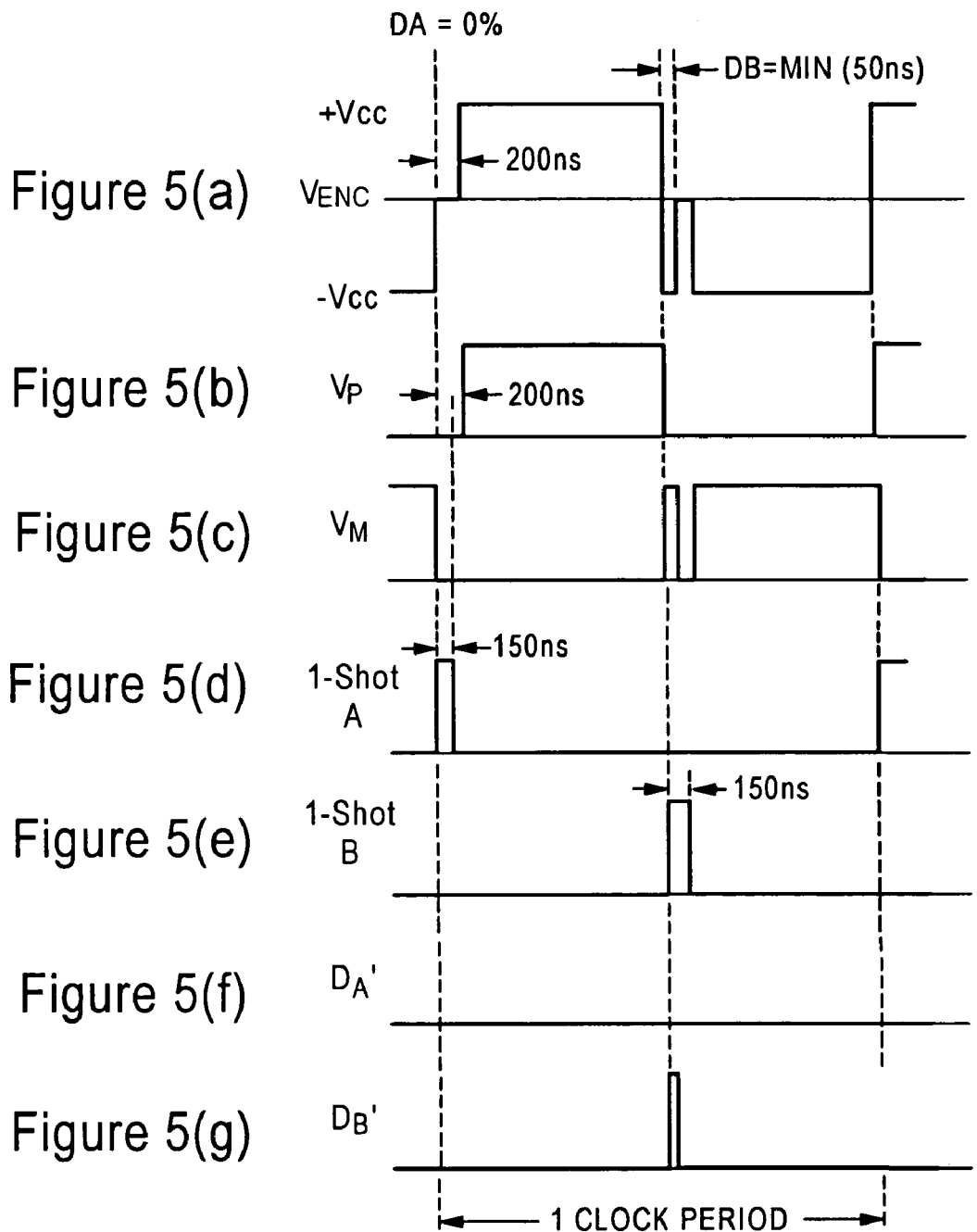
FIGS. 5(a)–5(g) correspond to the preceding figures, in which $D_A$ is at zero PWM duty cycle and $D_B$ is at a minimum, non-zero, PWM duty cycle value.

Referring to FIGS. 4(a)–4(g), the methodology that may be implemented by PWM encoder circuit 302 and decoder circuit 310 will be described in more detail. Referring initially to FIG. 4(a), each positive half-cycle of carrier $V_{ENC}$ is used for encoding the $D_A$ PWM duty cycle, and each negative half-cycle is used for encoding $D_B$ (although this sense could be reversed). Carrier $V_{ENC}$ is of an approximately square wave waveform, bipolar as depicted, substantially of constant repetition rate, and nominally of a 50% duty cycle. The period of the carrier waveform is represented as $(t_5-t_0)$ in FIG. 4(a), with the positive half cycle represented by $(t_4-t_0)$ and negative half cycle by $(t_5-t_4)$.

Assume for this example that the duty cycles of the PWM input signals at $V_{DA}$ and $V_{DB}$ are at 15% and 50%, respectively. A transition in the carrier $V_{ENC}$ at time ($t=t_0$) from $-V_{CC}$ to $+V_{CC}$, generated by encoder 302, indicates the beginning of a $D_A$ duty cycle on-time, and a transition from $-V_{CC}$ to $+V_{CC}$ at time ($t=t_4$) indicates the beginning of a $D_B$ duty cycle on-time. The end of either on-time is designated by a short duration transition of the waveform to zero, which occurs in the depicted example at the leading edge of a brief pulse, at time ($t=t_1$) for $D_A$. The width of the pulse, defined by the interval $(t_2-t_1)$ for waveform $D_A$, should be long enough to be unequivocally recognized by decoder 310 on the secondary side of the circuit 300, but as small as possible relative to the duration of the waveform period since power is not being transferred across the transformer 304 during a pulse. An exemplary pulse width is 100 ns, as depicted. No pulse appears for waveform $D_B$, which waveform, in this example, is at a prescribed maximum duty cycle of 50%.

Supplied to the inputs of PWM decoder 310 are successive carrier half cycles $V_P$ and $V_M$, shown in FIGS. 4(b) and 4(c), of the carrier $V_{ENC}$, which are obtained from the secondary winding 304b through the bridge 308. The two decoder inputs respond only to positive and negative polarity waveform components, respectively. The PWM duty cycle markers encoded in the waveform are detected (decoded) by decoder 310, the outputs, $V_{DA'}$ and $V_{DB'}$ shown in FIGS. 4(f) and 4(g), of which, are replications of the PWM input signals $V_{DA}$ and $V_{DB}$.

To decode the $D_A$ duty cycle signal in FIG. 4(a), the PWM decoder 310 operates as follows. A falling edge on $V_M$, FIG. 4(c), triggers a one-shot timer of exemplary 150 ns interval, FIG. 4(d). If a rising edge is detected on signal $V_P$, FIG. 4(b), before the end of the one-shot interval, then the $D_A$ duty cycle begins. Any subsequent falling edge on $V_P$ or low level on $V_P$ will thereafter indicate the end of the $D_A$ duty cycle. The decoder 310 determines this duration between beginning and end of duty cycle. The $D_B$ duty cycle of FIG. 4(a) is decoded in a similar manner. In this case, however, a maximum (50%) duty cycle is being transmitted.

In the example of FIGS. 4(a)–4(g), the duty cycles of PWM input signals $D_A$ and $D_B$ being processed are 15% and 50%, respectively, as aforementioned. However, the input duty cycles are mutually independent and arbitrary.

For example, FIGS. 5(a)–5(g) illustrate transmission of two special cases in which the duty cycle of PWM input signal $D_A$ is zero and that of $D_B$ is at a prescribed non-zero minimum value. The decoder input waveform corresponding to the input signal ($D_A$) is shown illustratively as $V_M$ in FIG. 5(c), and the waveform comporting with $D_B$ is shown as $V_P$ in FIG. 5(b). Because it would be disadvantageous to designate a zero PWM duty cycle by an absence of carrier during a half cycle, when no DC power would be transferred across the pulse transformer 304, decoder 310 implements a zero duty cycle detector which substantially does not disturb the carrier. Input signal $D_A$ is encoded by the use of a region of prescribed duration, e.g., 200 ns, slightly greater than the 150 ns one-shot interval, when $V_{ENC}=0$. The 150 ns one-shot interval has been decoded on DA' as a zero because the interval expires before a rising edge is seen on the $V_P$ input, as is apparent by comparing FIGS. 5(b) and 5(d). The 200 ns pulse for encoding zero PWM duty cycle must be longer than the 100 ns marker pulse indicating the end of the PWM duty cycle on-time to allow the decoder (described later) to distinguish between a true zero PWM duty cycle condition and a condition in which the PWM duty cycle of the preceding half-cycle ($D_B$ in this case) is somewhat less than 50%. This latter condition would result in up to a 100 ns delay between the falling edge of $V_M$ and the rising edge of $V_P$ (for the case of $D_A$ encoding, and would be decoded as a zero PWM duty cycle were it not for the longer 200 ns pulse used to indicate a zero PWM duty cycle.

FIGS. 5(a)–5(g) also illustrate encoding of a "minimum" non-zero PWM duty cycle for $D_B$. A minimum non-zero PWM duty cycle that will be encoded must be established to eliminate the possibility of transmitting a near-zero (but non-zero) PWM duty cycle that can cause up to a 100 ns delay between the falling edge of $V_P$ and the rising edge of $V_M$ (for the case of $D_B$ encoding). If such a delay were allowed, then the decoder would decode a "late turn on" for $D_B$, since the rising edge of $V_M$ would occur late but still within the 150 ns one-shot interval. Thus, the described encoding scheme allows the transmission of two independent PWM duty cycles that can be zero, or range from a minimum, e.g., 50 ns, up to a maximum of 50%.

It should be apparent that if only a single PWM duty cycle is needed, then the $D_B$ encoding can be omitted and only the $D_A$ duty cycle encoded. For this simplified case, the pulse duration where $V_{ENC}=0$ can be the same (e.g., 200 ns) for encoding zero PWM duty cycle and indicating the end of an on-time, and there is no need to establish a minimum non-zero PWM duty cycle.

Using this scheme, risk of incorrect decoding of the PWM duty cycle is reduced, because termination of the duty cycle is a level-sensitive event in PWM decoder 310, and not merely edge-sensitive. This ensures that the PWM signal does not become "stuck" in the on-state if a pulse is missed. Also, since either the $V_P$ or $V_M$ input to decoder 310 will be high at any given time, except during a brief pulse, a loss of signal from PWM decoder 310 can be rapidly detected.

For some topologies, a maximum PWM-signal duty cycle that is greater than 50% is often desirable. To implement a single-switch forward converter, for example, a single PWM signal may be encoded using a 75% duty cycle "square wave" as a carrier. As is appropriate for each application, either one or two PWM signals may be encoded using a carrier of any duty cycle value. The duty cycle of the carrier naturally establishes a maximum duty cycle for each of the encoded PWM signals. Because of the presence of the DC restoring capacitor (301 in FIG. 3), use of a carrier that is not 50% still maintains efficient full-wave power transfer, as well as the other advantages described above.

Encoder 302

Figure 6:
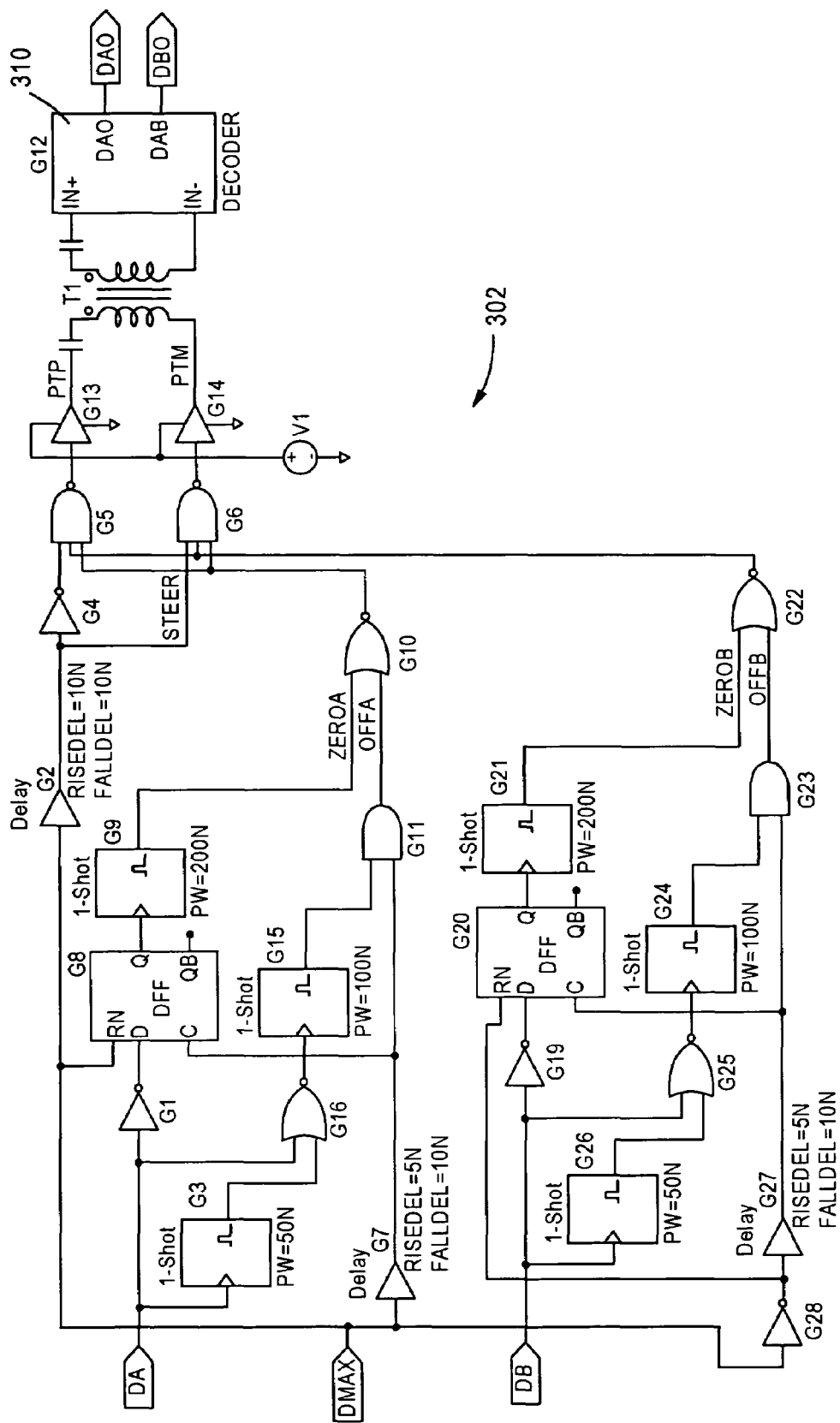
FIG. 6 is a detailed circuit diagram showing an implementation of the PWM encoder depicted in FIG. 3.

Encoder 302 will now be described in more detail, with reference to FIG. 6. Decoder 302 receives the PWM duty cycle information on the DA and DB inputs and the maximum duty cycle information on the DMAX input. Decoder 302 generates signals on the PTP and PTM outputs, whose differential voltage is applied to the transformer T1, corresponding to pulse transformer 304 in FIG. 3. The DMAX signal is delayed slightly by G2 to create a STEER signal. This signal in turn drives the outputs (PTP, PTM) in a generally complementary fashion through the Drivers (G13, G14), which are capable of delivering the bias power from the Supply (V1) to the transformer (T1). Thus, the DMAX signal approximately represents the carrier signal that is sent across the isolation boundary through T1.

Consider now the half cycle corresponding to DA signal encoding. For moderate PWM duty cycles (FIG. 7), the falling edge of the DA signal triggers 1-Shot (G15) through NOR gate (G16). This results in a brief (100 ns) high-pulse on the OFFA signal, which forces a zero-volt differential on the primary of transformer T1 through NOR gate (G10) and NAND gates G5,G6.

Figure 7:
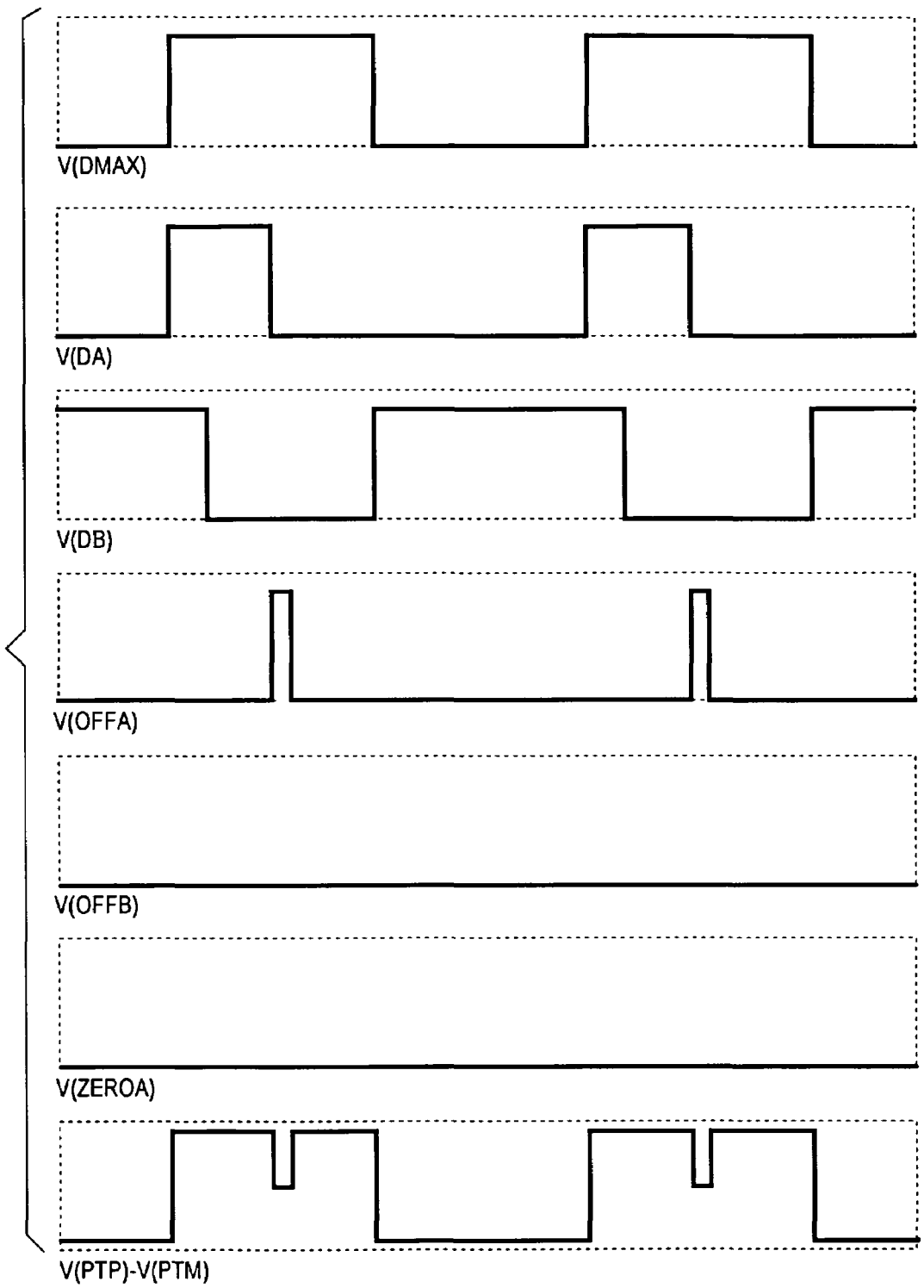
FIG. 7 shows waveforms for explaining the operation of the PWM encoder of FIG. 6 in which $D_A$ is at a nominal PWM duty cycle and $D_B$ exceeds a prescribed maximum PWM duty cycle.

Consider now the DB waveform of FIG. 7, when the input duty cycle exceeds the maximum duty cycle as set by DMAX. The DMAX signal going high will toggle the PTP & PTM outputs, and prevent the falling edge of DB from having any effect because of NAND gate (G23).

When the PWM duty cycle on DA is zero (FIG. 8), 200 ns 1-Shot (G9) and the resulting ZEROA signal are triggered by the rising edge of DMAX occurring when the DA signal is still low, as detected by Flip-Flop (G8). This indicates a zero PWM duty cycle condition, since the DA and DMAX signals normally rise together for a non-zero duty cycle on DA. Delay (G7) ensures that this condition is not accidentally indicated for the case when the DA signal rises slightly later than the DMAX signal. Delay (G2) is slightly longer than Delay (G7) to allow time for the ZEROA signal to occur before toggling the PTP and PTM signals.

Figure 8:
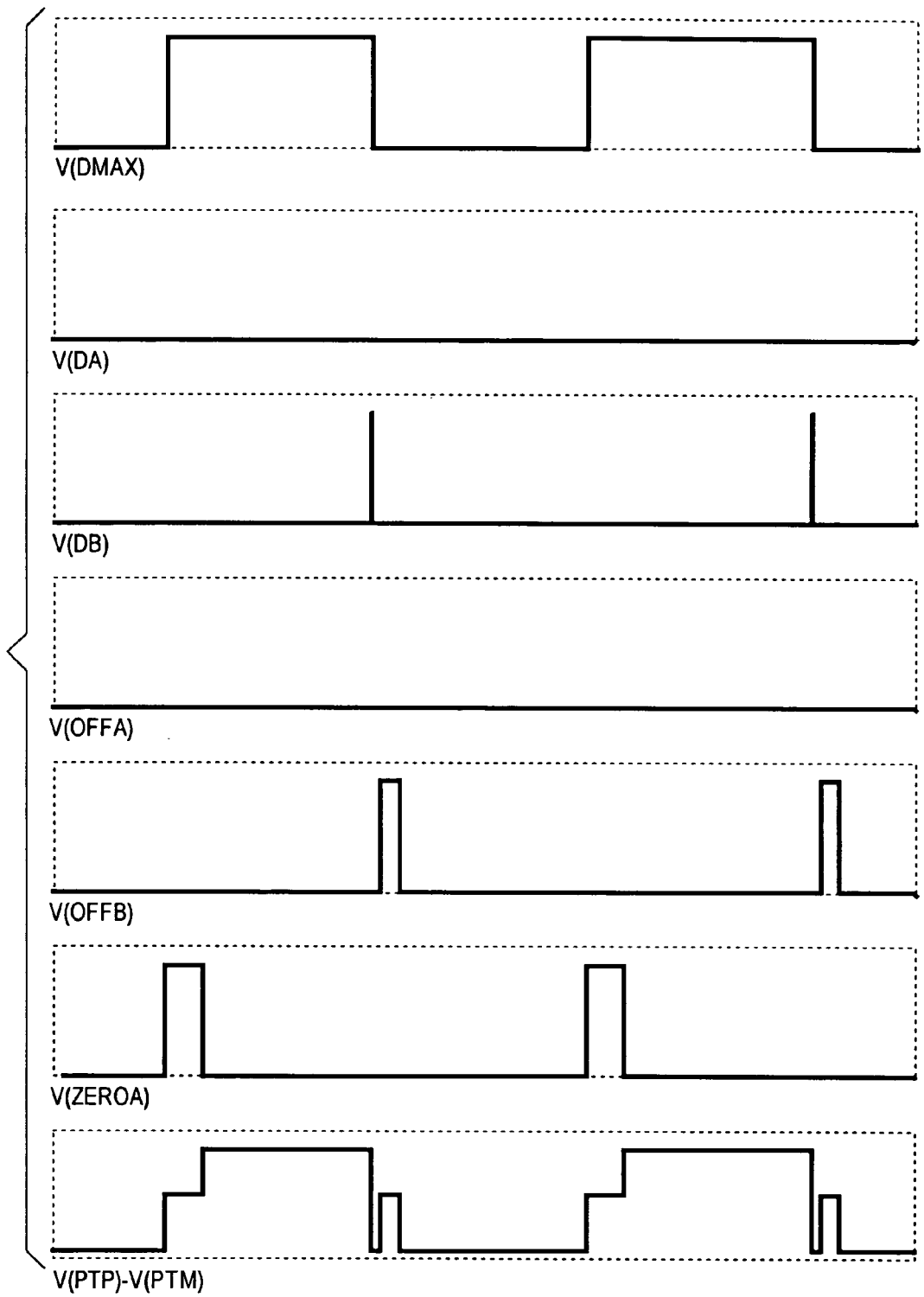
FIG. 8 shows waveforms for explaining the operation of the PWM encoder in which $D_A$ is at a zero PWM duty cycle and $D_B$ at less than a minimum, non-zero, PWM duty cycle.

FIG. 8 illustrates the case when the DB signal is below the prescribed minimum duty cycle. In this case, 1-Shot (G26) effectively lengthens the DB on-time (as seen by 1-Shot G24) to a minimum of 50 ns by way of example.

Decoder 310

Figure 9:
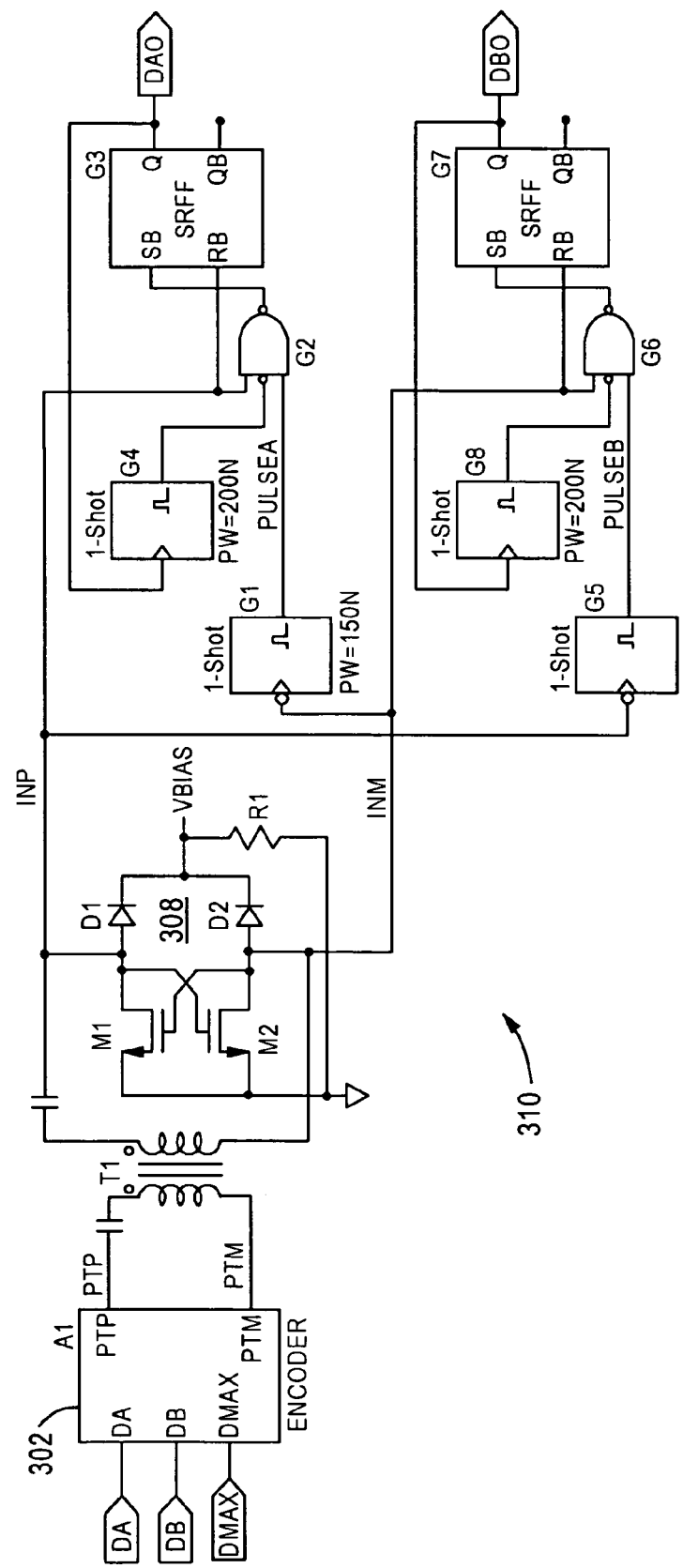
FIG. 9 is a circuit diagram showing an implementation of the PWM decoder of FIG. 3.

Decoder 310, shown in more detail in the circuit diagram of FIG. 9, receives encoded PWM duty cycle information and bias power from the encoder 302 through transformer (T1). Bridge rectifier (M1, M2, D1, D2) corresponding to rectifier 308 in FIG. 3, or other similar circuit, may be used to extract bias power at VBIAS in FIG. 9. The decoder 310 also extracts the PWM duty cycle information from the output of the transformer (T1) and produces signals at DAO and DBO that are essentially identical to those on the DA and DB inputs to encoder 302.

The bridge rectifier 308 shown uses partial synchronous rectification, which has two benefits. First, it increases the efficiency of power transfer. Second, it ensures that the common-mode voltage of the INP and INM signals never exceeds the gate threshold voltages of transistors M1 and M2. Therefore, when a zero-volt differential is present at the secondary winding of transformer T1, transistors M1 and M2 ensure that the INP and INM voltages are nearly at zero volt relative to the ground reference of the decoder 310.

Figure 10:
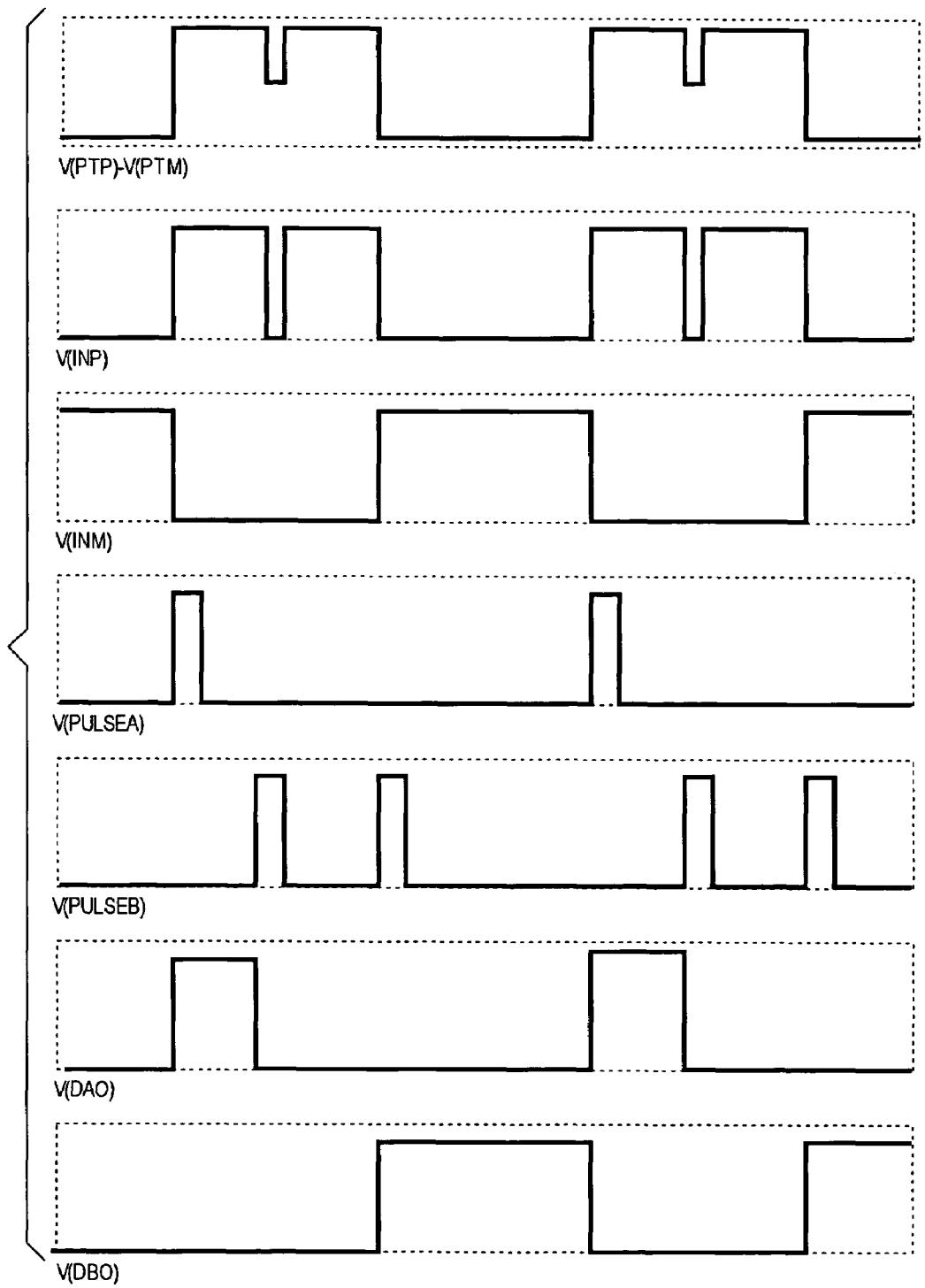
FIG. 10 shows waveforms for explaining the operation of the PWM decoder of FIG. 9, in which $D_A$ is at a nominal PWM duty cycle and $D_B$ exceeds a prescribed maximum PWM duty cycle.

Decoder 310 extracts PWM duty cycle information as follows. Referring to FIG. 10, the rising edge of the DAO signal (corresponding to the beginning of the "On-time") is determined by a rising edge on INP occurring soon after a falling edge on INM. The rising edge of the DBO signal is likewise determined by a rising edge on INM immediately after a falling edge on INP.

Referring now to the decoding of the DAO nominal duty cycle in FIG. 10. As the INM signal falls, the 1-Shot (G1) generates a 150 ns high-pulse on PULSEA. Since the INP signal goes high very soon after the INM signal goes low, the output of G2 provides the set signal for the flip-flop (G3), and the DAO output is set high. When DAO goes high, this also triggers the 200 ns 1-Shot (G4). The output of this 1-Shot prevents re-triggering (double pulsing) of G3 for low PWM duty cycle conditions. The end of the DAO signal (and reset of the flip-flop (G3)) is then determined by the falling edge of INP.

The decoding of a maximum PWM duty cycle on DBO is also illustrated in FIG. 10. In this case, there are two pulses generated by the falling edges of the INP signal. Only the second of these two pulses, however, causes a rising edge on the DBO signal, since the INM signal remains low throughout the duration of the first pulse on PULSEB.

Figure 11:
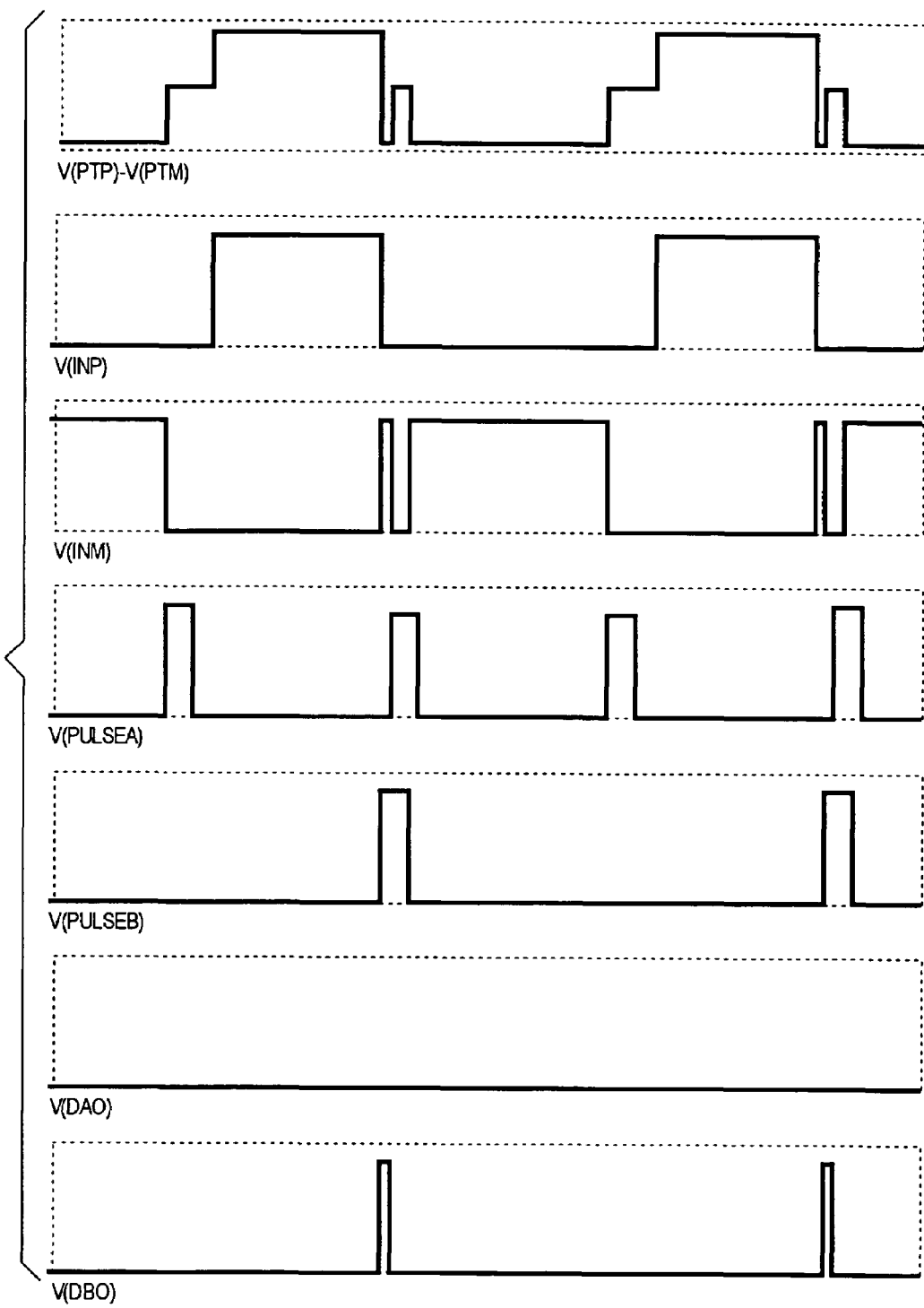
FIG. 11 shows waveforms for explaining the operation of the PWM decoder, in which $D_A$ is at a zero PWM duty cycle and $D_B$ at less than a minimum, non-zero, PWM duty cycle value.

FIG. 11 illustrates an example in which a zero duty cycle is encoded for DA. For this case, the rising edge of INP is delayed by approximately 200 ns with respect to the falling edge of INM. Consequently, the 150 ns high-pulse on PULSEA terminates before INP goes HIGH, and thus the output of the NAND gate (G2) never goes low to set the flipflop (G3). FIG. 11 also illustrates a minimum PWM duty cycle encoded for DB. Note that the output of the 200 ns 1Shot G8 is now needed to prevent a possible double pulsing on the decoded DBO signal, since there are two rising edges on the INM signal during the time that PULSEB is high.

One application of the teachings herein is in a PWM controller chipset for a secondary-side, synchronous-rectified forward converter. In this utilization, regulated DC power and PWM information may be transferred together from the secondary side of the main power transformer to the primary side via a single isolation transformer. This eliminates the need for a separate primary-side bias supply that is commonly used, and potentially a second pulse transformer (in applications where two duty cycles are transmitted). It is to be understood, however, that transfer of bias power, together with PWM information as uniquely implemented in accord with the teachings herein, is optional.

Although the present invention has been described with reference to particular means, materials and embodiments, from the foregoing description one skilled in the art can easily ascertain the essential characteristics of the present invention and various changes and modifications may be made to adapt the various uses and characteristics without departing from the spirit and scope of the present invention as described by the claims that follow.

What is claimed is:

1. A signal processing circuit for supplying duty cycle information across an isolation barrier, comprising:
   on one side of the isolation barrier, an encoder circuit configured for receiving at least one duty cycle input signal containing duty cycle information, and producing a carrier signal having a waveform of generally constant repetition rate and duty cycle, in which at least a portion of the carrier signal is encoded to have a waveform marker corresponding in position to the input duty cycle information wherein the presence of the waveform marker leaves the average value of the carrier waveform substantially unaffected.

2. The signal processing circuit of claim 1, including, on the other side of the isolation barrier, a decoder circuit configured to receive the carrier signal, detect the waveform marker, and reconstruct therefrom the duty cycle input signal.

3. The signal processing circuit of claim 1, including a DC power extraction circuit configured for extracting DC bias power from the carrier signal.

4. The signal processing circuit of claim 1, in which the encoder circuit is implemented to encode PWM duty cycle information.

5. The signal processing circuit of claim 4, in which the signal marker is a pulse with rising or falling edge at a timing corresponding to the input PWM duty cycle information.

6. The signal processing circuit of claim 1, in which the signal marker is a voltage level discontinuity.

7. The signal processing circuit of claim 4, in which the carrier signal is of bipolar waveform, in which alternate half cycles of the waveform are encoded by the PWM encoder circuit with mutually independent PWM duty cycle information.

8. The signal processing circuit of claim 6, in which the discontinuity is a pulse of short duration superimposed on the waveform.

9. The signal processing circuit of claim 7, in which the carrier waveform is a square wave waveform.

10. The signal processing circuit of claim 9, in which the square wave waveform is bipolar.

11. The signal processing circuit of claim 10, in which the marker is a pulse of short duration superimposed on the square wave waveform.

12. The signal processing circuit of claim 3, in which the DC power extraction circuit comprises a bridge rectifier circuit coupled to a capacitor on which a DC bias voltage is developed.

13. The signal processing circuit of claim 12, in which the bridge rectifier circuit comprises a full wave bridge circuit.

14. The signal processing circuit of claim 1, including a zero duty cycle detection circuit configured to establish a zero duty cycle information modulated waveform.

15. The signal processing circuit of claim 4, in which the PWM decoder includes a one-shot timer circuit triggered in response to a transition at the end of one half cycle of the carrier waveform to establish a reference interval, and a detection circuit for detecting absence of a transition at the beginning of the next half cycle of the carrier waveform occurring within the reference interval for determining a zero duty cycle information on said next half cycle of the waveform.

16. The signal processing circuit of claim 1, in which the isolation barrier is a pulse transformer.

17. The signal processing circuit of claim 4, in which the one side of the isolation barrier includes a DC blocking capacitor coupled to an output of the PWM encoder circuit.

18. The signal processing circuit of claim 4, including a DC power extraction circuit configured for extracting DC bias power from the carrier signal, in which the PWM decoder circuit and DC bias power extraction circuit are connected in shunt with one another.

19. The signal processing circuit of claim 9, in which the carrier waveform is of a prescribed maximum 50% duty cycle.

20. A synchronous forward converter including the signal processing circuit of claim 1.

21. A synchronous forward converter including the signal processing circuit of claim 3.

22. The signal processing circuit of claim 4, wherein the PWM encoder circuit is implemented by logic elements configured to produce complementary output signals applied to a primary winding of the isolation transformer.

23. The signal processing circuit of claim 2, wherein the decoder circuit is a PWM decoder circuit implemented by logic elements including a flip-flop circuit coupled to receive duty cycle timing information from a secondary winding of the isolation transformer.

24. The signal processing circuit of claim 7, in which the encoder circuit is configured to receive first and second input signals of mutually arbitrary first and second PWM duty cycle, and in response produce the bipolar carrier signal in which alternate half cycles are encoded with the first and second PWM duty cycle information, respectively, and in which the decoder circuit is configured to receive the encoded alternate half cycles and, in response, produce output signals corresponding to the first and second input signals, respectively.

25. A method of supplying bias power and duty cycle information across an isolation barrier, comprising the step of:
   at an input side of the isolation barrier,
      receiving an input signal having duty cycle information and producing a carrier signal having a waveform of generally constant repetition rate and duty cycle, in which a portion of the carrier signal is encoded with a signal marker corresponding in content to input duty cycle information wherein the presence of the waveform marker leaves the average duty cycle of the carrier waveform substantially unaffected.

26. The method of claim 25, including:
at an output side of the isolation barrier,
  detecting the duty cycle information in the carrier signal, and
  using the detected duty cycle information, reconstructing the input duty cycle signal.

27. The method of claim 25, including:
extracting DC bias power from the carrier signal.

28. The method of claim 25, in which encoding is PWM encoding.

29. The method of claim 25, in which the signal marker is a waveform discontinuity at a timing corresponding to the input duty cycle information.

30. The method of claim 25, in which the carrier signal is of a prescribed maximum 50% duty cycle.

31. The method of claim 25, in which the carrier signal is of a bipolar square wave carrier waveform.

32. The method of claim 25, including encoding alternate half cycles of the carrier waveform at the input side of the isolation barrier with mutually independent duty cycle information.

33. The method of claim 29, including superimposing the discontinuity as a pulse of short duration superimposed on the square wave carrier waveform.

34. The method of claim 25, detecting a zero duty cycle information encoded carrier waveform.

35. The method of claim 34, wherein the step of detecting includes generating a pulse of prescribed fixed duration in response to a transition at the end of one half cycle of the carrier waveform to establish a reference interval, and detecting an absence of transition at the beginning of the next half cycle of the carrier waveform occurring within the reference interval for determining a zero duty cycle information in said next half cycle of the carrier waveform.

36. The method of claim 31, including receiving first and second input signals of mutually arbitrary first and second duty cycle, and in response producing the bipolar carrier signal in which alternate half cycles are encoded with the first and second duty cycle information, respectively, and receiving the encoded alternate half cycles and, in response, produce output signals corresponding to the first and second input signals, respectively.

37. A signal processing circuit in which input duty cycle information and DC bias power are transferred across an isolation barrier, comprising:
  means arranged at an input side of the isolation barrier for receiving at least one input signal having duty cycle information, and producing a carrier signal having a waveform of generally constant repetition rate and duty cycle, and means for encoding a portion of the carrier signal with a marker corresponding in content to the input duty cycle information contained in the at least one input signal such that the marker leaves the average value of the carrier signal substantially unaffected.

38. The signal processing circuit of claim 37, including:
means arranged at an output side of the isolation barrier for detecting the duty cycle information in the carrier signal, and in response, reconstructing the at least one input signal.

39. The signal processing circuit of claim 37, including means for extracting DC bias power from the carrier signal.

* * * * *